United States Patent [19]

Shaw et al.

[11] Patent Number: 5,565,303

[45] Date of Patent: Oct. 15, 1996

[54] PHOTOSENSITIVE PRINTING PLATE DEVELOPED BY A PEEL-APART PROCESS

[76] Inventors: Sonya Y. Shaw, 1509 Jeanette Way, Carrollton, Tex. 75006; Wayne A. Mitchell, 465 W. Orangewood #174, Anaheim, Calif. 92802; David R. Beresford, 204 Paradise Dr., Savanna, Ga. 31406

[21] Appl. No.: 875,864

[22] Filed: May 4, 1992

Related U.S. Application Data

[63] Continuation-in-part of Ser. No. 630,119, Dec. 19, 1990, abandoned.

[51] Int. Cl.⁶ .................................................... G03F 7/00
[52] U.S. Cl. .................... 430/302; 430/300; 430/309; 101/463.1
[58] Field of Search ................................. 430/253, 300, 430/302, 309; 101/463.1

[56] References Cited

U.S. PATENT DOCUMENTS

| | | | |
|---|---|---|---|
| 4,175,964 | 11/1979 | Uchida et al. | 430/306 |
| 4,284,703 | 8/1981 | Inoue et al. | 430/142 |
| 5,049,476 | 9/1991 | Platzer | 430/253 |

FOREIGN PATENT DOCUMENTS

| | | |
|---|---|---|
| 2377654 | 8/1978 | France . |
| 2009953 | 6/1979 | United Kingdom . |
| 1090663 | 7/1980 | United Kingdom . |
| 1570967 | 7/1980 | United Kingdom . |
| 2153100 | 8/1985 | United Kingdom . |

*Primary Examiner*—S. Rosasco

[57] ABSTRACT

A method for producing a press-ready lithographic printing plate which comprises:

(A) providing an uncoated lithographic substrate;

(B) coating a photosensitive layer on one side of the lithographic substrate;

(C) providing a flexible substrate;

(D) coating an adhesive layer directly on the flexible substrate;

(E) laminating the coated lithographic substrate to the coated flexible substrate;

(F) imagewise exposing the laminated element of (E) to radiation to which the photosensitive layer is sensitive; and (G) peeling off the flexible substrate along with the nonimage areas of the photosensitive layer, leaving the press-ready image areas of the colored photosensitive layer and the adhesive layer on the lithographic substrate.

14 Claims, No Drawings

PHOTOSENSITIVE PRINTING PLATE DEVELOPED BY A PEEL-APART PROCESS

This is a continuation-in-part of U.S. Ser. No. 07/630,119, Filed Dec. 19, 1990, now abandoned.

BACKGROUND OF THE INVENTION

The present invention relates to printing plates. In particular, it relates to a printing plate system wherein the image is produced by peel-apart process.

In the printing field, it is sometimes desirable to directly produce lithographic plates. This eliminates the need for an image development processor and a wet developer.

At present time, there are two liabilities to the use of printing plates. First, a processor is needed for image development, which is both expensive for the customer and the vendor and requires significant floor space. Second, a wet developer is normally used, which is messy and often contains ingredients which are or may eventually be classified as hazardous.

In the present invention, the need is eliminated for both a development processor and a wet developer by dry developing the printing plate by a peel-apart process. After exposure, the plate is developed by peeling off a disposable development sheet. This eliminates the messy handling and potential environmental problems associated with liquid developers. Furthermore, no floor space or special plumbing are needed, since the processor has been eliminated.

U.S. Pat. Nos. 4,210,711, 4,334,006 and 4,396,700 cover peel-apart printing plates. All disclose a peel-apart process for forming an image. The processes eliminate the wet processor, but require a laminator, which is normally not needed for developing printing plates. These systems consist of a photosensitive layer coated on a grained/anodized aluminum plate. A film separation is brought into intimate contact with the photosensitive layer and exposed to UV. After exposure, the laminate film is laminated onto the photosensitive layer and the exposed or unexposed areas are peeled-off. The photosensitive composition in these patents is comprised of diazonium salts and various binders. The peel-development sheet is laminated to the photosensitive composition after exposure. When peel-developed, the adhesive layer on the laminate film is completely removed.

The present invention utilizes a photosensitive composition containing a photopolymerizable monomer, a binder, a photoinitiator and at least one colorant. Lamination of the peel-development sheet occurs before exposure preferably during manufacture of the plate. When peel-developed, the adhesive layer remains on the image areas on the aluminum plate and is removed in the non-image areas with the carrier. This ensures that the consumer will not need a laminator to use the product.

Dupont's U.S. Pat. Nos. 4,489,153 and 4,489,154 disclose a peel-apart process used only for color proofing. In this process, a Mylar sheet is coated with a photosensitive composition. This film is then laminated by the customer to a receiver base and then exposed through the Mylar sheet. Peeling off the Mylar sheet develops the image.

The present invention relates to a photosensitive assembly consisting of a film coated on a printing plate, e.g. aluminum, with a development sheet covering the photosensitive film. The assembly is exposed through a mask, and the development sheet is peeled off to remove the unexposed areas. The exposed areas remain to form an ink-receptive image.

SUMMARY OF THE INVENTION

The present invention relates to a method for producing a press-ready lithographic printing plate which comprises:
(A) providing an uncoated lithographic substrate;
(B) coating a photosensitive layer on one side of the lithographic substrate;
(C) providing a flexible substrate;
(D) coating an adhesive layer directly on the flexible substrate;
(E) laminating the coated lithographic substrate to the coated flexible substrate;
(F) imagewise exposing the laminated element of (E) to radiation to which the photosensitive layer is sensitive; and
(G) peeling off the flexible substrate along with the nonimage areas of the photosensitive layer, leaving the press-ready image areas of the colored photosensitive layer and the adhesive layer on the lithographic substrate.

In the preferred embodiments, the exposing of the photosensitive layer is conducted with laser radiation, visible light or ultraviolet light. The flexible substrate preferably comprises a polymeric film and the lithographic substrate is preferably aluminum.

The photosensitive layer preferably comprises:
(A) at least one photopolymerizable compound, comprising a photoinitiator and a component having at least one ethylenically unsaturated group polymerizable by free radicals, wherein the photopolymerizable compound is present in sufficient amount to provide image differentiation when the composition is imagewise exposed to actinic radiation; and
(B) at least one binder resin, present in sufficient amount to bind the composition into a uniform film.

The adhesive layer preferably comprises a thermoplastic resin which has a Tg in the range of 25° C. to about 100° C. The adhesive layer is solvent coated onto the flexible substrate or is coated on to the flexible substrate from the melt. The lithographic substrate is preferably grained, anodized and treated with a hydrophilizing agent which, preferably, is a silicate or a polymeric acid.

DETAILED DESCRIPTION OF THE PREFERRED EMBODIMENT

Lithographic printing plates generally are composed of an aluminum containing substrate which may or may not have been treated with a variety of processes recognized in the art including anodization, graining and hydrophilization. The thusly prepared substrate may then be applied with a photosensitive coating. A typical sheet substrate suitable for the manufacture of lithographic printing plates include grades 3003 and 1100 commercially available from Alcoa, VAW, Fuwakawa, Alcan, Conalco or Nippon Light Metal. The substrate is usually pretreated by graining, etching and anodizing techniques as are well known in the art, and also may or may not have been treated with a composition, such as sodium silicate, suitable for use as a hydrophilizing layer. The treated surface of the substrate is coated with a light sensitive, film-forming composition. Such compositions may also contain binding resins, such as polyvinyl formal resins, colorants, acid stabilizers, surfactants, exposure indicators or other art recognized ingredients.

The photosensitive coating mixture is typically prepared in a solvent composition which is compatible with all the other composition ingredients. The light sensitive composition is then coated on the substrate and the solvent evaporated.

A photopolymeric photosensitive coating typically comprises a photopolymerizable monomer, a photoinitiator, a binder resin, and optional other ingredients known in the art.

The photopolymerizable monomer preferably comprises a nongaseous (boiling temperature above 100° C. at normal atmospheric pressure), ethylenically-unsaturated compound containing at least one and preferably at least two terminal unsaturated groups, and being capable of forming a high molecular weight polymer by free radical initiation, chain propagating addition polymerization. The most preferred compounds are acrylate or methacrylate monomers, as are well known in the art. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol, a ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Photoinitiators may include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acryloins in U.S. Pat. No. 2,722,512; polynuclear quinones in U.S. Pat. Nos. 2,951,758 and 3,046,127; and s-triazines in U.S. Pat. No. 4,656,272. Other photoinitiators include 2,3-di(4-methoxyphenyl)quinoxaline, 9-phenylacridine, bis(2,4,5-triphenyl)imidazole, benzoyl peroxide, titanocene, bistrichloromethyl-s-triazine and their derivatives.

The photopolymerizable layer also typically contains a binder resin which not only determines the hardness and/or flexibility of the coating but is also used to control the dry development. Binder resins found suitable for the layer are polyvinyl acetates, styrene/maleic anhydride copolymers and their half esters; acrylic polymers and copolymers; polyamides; polyvinyl pyrrolidones; cellulose and its derivatives; phenolic resins; polyvinyl formals; polyvinyl butyral, polyvinyl propional; polyvinyl acetates and the like.

Dyes and/or pigments may be included to spectrally sensitize the photoinitiator, such as described in U.S. Pat. Nos. 4,282,309 and 4,454,218, and European Patents 0,179,448 and 0,211,615.

Other ingredients which may be present in the photopolymerizable layer are thermal polymerization inhibitors, plasticizers, oligomers, residual solvents, surfactants, inert fillers, antihalation agents, hydrogen atom donors, and photoactivators.

In the preferred embodiment, the dry photopolymerizable layer has a coating weight range of from about 0.1 to about 5 g/m². The more preferred coating weight is from about 0.4 to about 2 g/m².

In the practice of the present invention, the photopolymerizable monomer component is preferably present in the photosensitive layer in an amount ranging from approximately 10 to 60% based on the weight of the solids in the layer. A more preferred range is from approximately 15% to 40%.

In the practice of the present invention, the photoinitiator component is preferably present in the photosensitive layer in an amount ranging from approximately 2 to 30% based on the weight of the solids in the layer. A more preferred range is from approximately 6% to 20%.

In the practice of the present invention, the binder resin component is preferably present in the photosensitive layer in an amount ranging from approximately 10% to 75% based on the weight of the solids in the layer. A more preferred range is from approximately 20% to 50%.

Bonded to the surface of the printing plate is the photosensitive layer. The photosensitive layer broadly comprises a photosensitizer, colorant, binder resin, and other optional ingredients such as plasticizers, stabilizers, surfactants, antistatic compositions, uv absorbers, optical brighteners, inert fillers, photoactivators, spectral sensitizers, antihalation agents, hydrogen atom donors, exposure indicators, polymerization inhibitors and residual coating solvents.

In the preferred embodiment, the photosensitizer is a combination of photoinitiator and photopolymerizable monomer. The photoinitiator is a compound which liberates free radicals upon exposure to actinic radiation like mentioned in the description for the photopolymerizable layer. The monomer is a nongaseous, ethylenically unsaturated compound containing at least two terminal unsaturated groups and being capable of forming a high molecular weight polymer by free radical initiation, chain propagating addition polymerization, like mentioned in the description for the photopolymerizable layer.

Dyes and/or pigments are included in the photosensitive layer to provide color to the image areas. Preferred colorants for this invention are pigments rather than dyes. The pigments are typically dispersed with an organic binder in an organic solvent or mixture of organic solvents. The pigments may be organic or inorganic. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Binders found suitable for the photosensitive layer include styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Other ingredients which may be present in the photosensitive layer are the acid stabilizers, thermal polymerization inhibitors, plasticizers, oligomers, residual solvents, surfactants, inert fillers, antihalation agents, hydrogen atom donors, photoactivators, and optical brightening agents.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the practice of the present invention, the colorant component is preferably present in an amount sufficient to uniformly color the photosensitive layer. It is preferably present in an amount ranging up to about 50% based on the weight of the solids in the layer. A more preferred range is up to about 40%.

Suitable acid stabilizers useful in the photosensitive composition layer include phosphoric, citric, benzoic, m-nitro benzoic, p(p-anilino phenylazo) benzene sulfonic acid, 4,4'-dinitro-2,2'-stilbene disulfonic, itaconic, tartaric, and p-toluene sulfonic acid, and mixtures thereof.

To form the photosensitive composition layer, the composition components may be dissolved in a solvent or mixture of solvents to facilitate application of the composition to the support or to the optional photopolymerizable layer.

Suitable solvents for this purpose may include water, tetrahydrofuran, gamma butyrolactone, glycol ethers such as propylene glycol monomethyl ether and methyl cellosolve, alcohols such as ethanol and n-propanol, and ketones such as methyl ethyl ketone. In general, the solvent system is evaporated from the coating composition once it is applied. However, some insignificant amount of solvent may remain as residue.

In the preferred embodiment, the photosensitive layer has a coating weight between approximately 0.1 and 5.0 g/m$^2$. The most preferred weight is from about 0.5 to 2.0 g/m$^2$.

The adhesive layer is next applied to the photosensitive layer. The purpose of the adhesive layer on the photosensitive layer is to transfer the unexposed areas of the photosensitive layer to a development sheet. It may be applied to the photosensitive layer in several different ways. It can be coated directly onto the photosensitive layer out of organic or aqueous based solvent mixtures, or it can be applied by hot melt extrusion, lamination, or coating. The adhesive layer preferably comprises a major amount of one or more thermoplastic polymers and may optionally contain such other desired components as uv absorbers, antistatic compositions, optical brighteners inert fillers, and plasticizers. Suitable polymers nonexclusively include vinyl acetal resins such as Butvar B-72 or B-79 available from Monsanto; acrylic resins such as Elvacite 2044 available from Dupont; ethylene resins such as Elvax 210 available from Dupont and vinyl chloride resins such as Hostaflex CM 133 available from Hoechst AG. Preferred are polyvinyl acetate resins such as Mowilith 30 available from Hoechst. These are usually dispersed in water, or dissolved in methyl isobutyl ketone or n-butyl acetate or other solvent compositions, for coating on a development sheet. It is then dried to a coating weight of from about 2 to about 30 g/m$^2$, more preferably from about 4 to about 20 g/m$^2$. The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS 1/2, available from Hercules. The layer should be transferable to a receiver sheet in a temperature range of from about 60° C. to about 180° C., preferably 60° C. to 120° C., more preferably 60° C. to 100° C. when laminated with heat and pressure. In the preferred embodiment, the thermoplastic polymer of polymers are present in the adhesive layer in an amount of greater than about 50% by weight. The plasticizer may be present in an amount of up to about 30% by weight, the uv absorber up to about 20% by weight, and other resins up to about 50% by weight.

Lamination may be conducted by putting the adhesive layer of the cover article in contact with the photosensitive aluminum carrier sheet and then introducing the materials into the nip of a pair of heated laminating rollers under suitable pressure. Suitable laminating temperatures usually range from approximately 60° C. to 120° C., preferably from 70° C. to 100° C.

The photosensitive element is exposed by means well known in the art through a mask and the transparent development sheet. This exposure may be conducted by exposure to actinic radiation from a light source such as mercury vapor discharge lamps or metal halide lamps. Other radiation sources, such as carbon arc, pulsed xenon, and lasers, may also be used.

After exposure, a positive image is formed on the printing plate by stripping off the development sheet from the printing plate with a steady, continuous motion. No devices are necessary to hold down the printing plate during stripping because only moderate manual peeling forces are needed to separate the materials. The preferred peel angle relative to the peel direction is greater than 90°. The delamination leaves the nonimage areas of the photosensitive layer attached to the development sheet. The image areas of the photosensitive layer remain on the printing plate. Thus, an image is formed on the printing plate. At this time, the image may be postexposed to destroy any residual nonexposed photosensitizer present in the image.

The following nonlimiting examples serve to illustrate the present invention.

EXAMPLE 1

A photosensitive emulsion containing the formulation (in grams):

| | |
|---|---|
| Tetrahydrofuran | 23.17 |
| Dowanol PM (1-methoxy-2-propanol) | 46.35 |
| Diacetone Alcohol | 17.38 |
| Sartomer 399 (Dipentaerythritol pentaacrylate) | 1.86 |
| RB-779 (2,3-bis[4-methoxyphenyl quinoxaline]) | 0.46 |
| Formvar 12/85 | 0.12 |
| *Cyan Formvar Dispersion | 11.59 |

*Consists of 44 parts, by weight, gamma-butyrolactone, 44 parts Dowanol PM, 5.25 parts Formvar 12/85 and 6.75 parts Hostaperm D2G pigment.

was whirler coated onto a grained, anodized aluminum substrate to a coating weight of 1.2 g/m$^2$. Pressmatch High Gloss Sheet (10 g/cm$^2$ of Mowilith 30 adhesive, coated on Melinex 505) was laminated onto the photosensitive layer at 180° F. A mask was placed on the High Gloss sheet and exposed to actinic light. At room temperature, the High Gloss sheet was peeled off to remove the unexposed portions of the photosensitive layer. The adhesive with the photosensitive layer was removed in the nonimage areas of the plate. In the image areas, the adhesive remained on the image areas when the polyester development layer was peeled off. The plate was then treated with PMF (Hoechst Celanese PPNA Product?) and inked. The ink adhered only to the image areas.

EXAMPLE 2

Repeat of method in Example 1 using the following formulation (in grams):

| | |
|---|---|
| Tetrahydrofuran | 23.17 |
| Dowanol PM | 46.35 |
| Diacetone Alcohol | 17.38 |
| Sartomer 399 | 1.86 |
| RB-779 | 0.46 |
| Formvar 12/85 | 0.12 |
| Cyan Formvar Dispersion | 11.59 |
| Carboset XL-44 (Acrylic copolymer adhesive, available from B. F. Goodrich Company) | 0.25 |

The presence of the Carboset reduced the peel force.

EXAMPLE 3

Repeat of method in Example 1 using the following formulation (in grams):

| | |
|---|---|
| Tetrahydrofuran | 22.68 |
| Dowanol PM | 36.21 |
| Diacetone alcohol | 17.01 |
| Gamma-Butyrolactone | 4.73 |
| Renolblau 5% dispersion (5% Renolblau pigment dispersed in 95%, by weight Mowital polyvinyl butyral from Hoechst AG) | 14.62 |
| Sartomer 399 | 1.78 |
| RB 779 | 0.44 |
| VERR-40 (Union Carbide) (epoxy modified vinyl chloride vinyl acetate copolymer) | 1.95 |
| VMCA (Union Carbide) (carboxy modified vinyl chloride/vinyl acetate copolymer) | .39 |
| Carboset XL-44 (acrylic adhesive available from B. F. Goodrich Company) | 0.20 |

EXAMPLE 4

Repeat of method in example 1 using the following formulation (in grams):

| | |
|---|---|
| Tetrahydrofuran | 22.80 |
| Dowanol PM | 45.61 |
| Diacetone Alcohol | 17.10 |
| PETA (Pentaerythritol tetraacrylate) | 1.86 |
| Bu 1861 (Bis-trichloromethyl stilbenyl triazine) | 0.064 |
| Carboset 525 (acrylic adhesive, available from B. F. Goodrich Company) | 0.96 |
| Formvar Cyan Dispersion | 11.60 |

EXAMPLE 5

Repeat of the method in Example 1 using the following formulation (in grams):

| | |
|---|---|
| Tetrahydrofuran | 23.27 |
| Dowanol PM | 37.15 |
| Diacetone alcohol | 17.45 |
| Gamma-Butyrolactone | 4.85 |
| Sartomer 399 | 1.83 |
| RB 779 | 0.45 |
| Renolblau 5% dispersion | 15.00 |
| Carboset GA 1364 (acrylic adhesive, available from B. F. Goodrich Company) | 2.00 |

We claim:

1. A method for producing a press-ready lithographic printing plate which comprises:
    (A) providing an uncoated lithographic substrate;
    (B) providing a photosensitive layer on one side of the lithographic substrate;
    (C) providing a flexible substrate;
    (D) providing an adhesive layer directly on the flexible substrate;
    (E) laminating the flexible substrate via said adhesive layer to said photosensitive layer on the lithographic substrate;
    (F) imagewise exposing the laminated element of (E) to radiation to which the photosensitive layer is sensitive; and
    (G) peeling off the flexible substrate along with the nonexposed areas of the photosensitive layer and areas of the adhesive layer corresponding to said nonexposed areas, leaving the exposed areas of the photosensitive layer and areas of the adhesive layer corresponding to said exposed areas on the lithographic substrate.

2. The method of claim 1 wherein the exposing of the photosensitive layer is conducted with laser radiation.

3. The method of claim 1 wherein the exposing of the photosensitive layer is conducted with visible light radiation.

4. The method of claim 1 wherein the exposing of the photosensitive layer is conducted with ultraviolet light radiation.

5. The method of claim 1 wherein the flexible substrate comprises polymeric film.

6. The method of claim 1 wherein the lithographic substrate is aluminum.

7. The method of claim 6 wherein the lithographic substrate is grained, anodized and treated with a hydrophilizing agent.

8. The method of claim 7 wherein the hydrophilizing agent is a silicate.

9. The method of claim 7 wherein the hydrophilizing agent is a polymeric acid.

10. The method of claim 1 wherein the photosensitive layer comprises:
    (A) at least one photopolymerizable compound, comprising a photoinitiator and a component having at least one ethylenically unsaturated group polymerizable by free radicals, wherein the photopolymerizable compound is present in sufficient amount to provide image differentiation when the composition is imagewise exposed to actinic radiation; and
    (B) at least one binder resin, present in sufficient amount to bind the composition into a uniform film.

11. The method of claim 1 wherein the adhesive layer comprises a thermoplastic resin which has a Tg in the range of 25° C. to about 100° C.

12. The method of claim 1 wherein the adhesive layer is solvent coated onto the flexible substrate.

13. The method of claim 1 wherein the adhesive layer is coated on to the flexible substrate from the melt.

14. The method of claim 1 wherein the image produced on the lithographic printing plate is a negative image.

* * * * *